United States Patent [19]
Kleyer

[11] Patent Number: 5,223,038
[45] Date of Patent: Jun. 29, 1993

[54] APPARATUS FOR PRODUCING METAL-FREE STRIPS

[75] Inventor: Siegfried Kleyer, Hainburg, Fed. Rep. of Germany

[73] Assignee: Leybold AG, Hanau, Fed. Rep. of Germany

[21] Appl. No.: 673,696

[22] Filed: Mar. 8, 1991

[30] Foreign Application Priority Data

Jan. 11, 1991 [DE] Fed. Rep. of Germany ....... 4100643

[51] Int. Cl.$^5$ ............................................. C23C 14/24
[52] U.S. Cl. .................................. 118/718; 118/720; 118/726
[58] Field of Search ...................... 118/718, 720, 726

[56] References Cited

U.S. PATENT DOCUMENTS

| | | | |
|---|---|---|---|
| 3,333,982 | 8/1967 | Horn | 118/726 |
| 3,764,382 | 10/1973 | Danilov | 118/720 |
| 4,832,983 | 5/1989 | Nagatomi | 427/81 |
| 4,962,725 | 10/1990 | Heinz | 118/718 |

FOREIGN PATENT DOCUMENTS

| | | |
|---|---|---|
| 0447550 | 9/1991 | European Pat. Off. . |
| 1262732 | 9/1968 | Fed. Rep. of Germany . |
| 59-179777 | 10/1984 | Japan .................................. 118/720 |
| 9006586 | 6/1990 | PCT Int'l Appl. . |
| 0295688 | 1/1954 | Switzerland . |
| 2219008 | 11/1989 | United Kingdom ................ 118/720 |

Primary Examiner—Richard Bueker
Attorney, Agent, or Firm—Felfe & Lynch

[57] ABSTRACT

The invention relates to an apparatus for producing metal-free strips on film webs coated in a vacuum, particularly for capacitors comprising a housing that can be pressure-tight sealed. The apparatus has a device for taking in the film web and also comprises an evaporating source provided in the housing with at least one nozzle 36 for the application of the evaporating agent onto the passing web of film. The nozzle, for this purpose, comprises one or several openings 58 extending over the entire width of the film web through which the agent is applied onto the film web by vapor deposition.

10 Claims, 3 Drawing Sheets

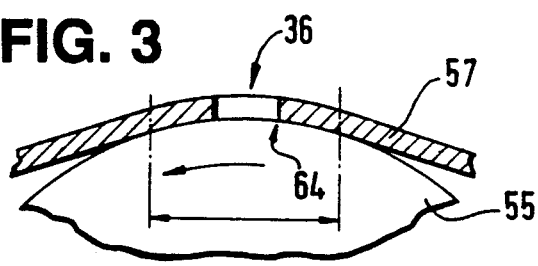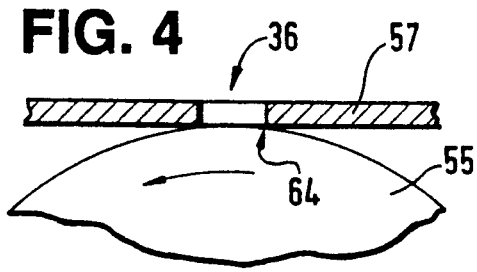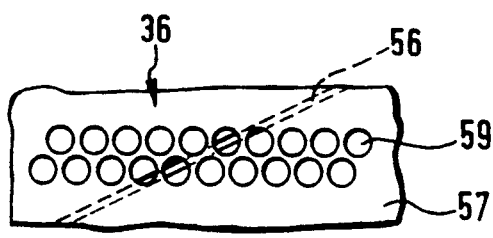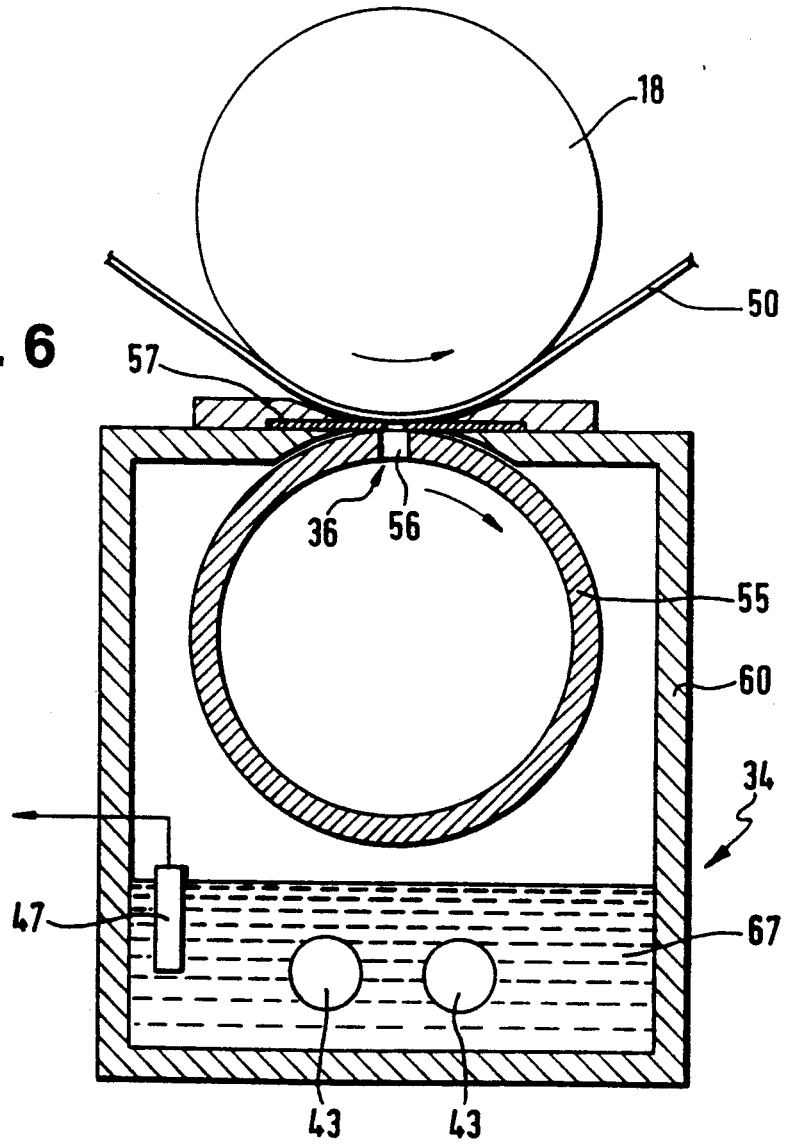

APPARATUS FOR PRODUCING METAL-FREE STRIPS

Apparatus for producing metal-free strips on film webs coated in a vacuum, particularly for capacitors, comprising a housing which closes pressure-tight and accommodates a device for taking in and conveying a film web, particularly for capacitors, as well as a coating source provided in the housing which has at least one nozzle for the outlet of the medium to be evaporated in order to avoid deposition on the passing film web.

Also known is an apparatus for the simultaneous vapor deposition of several parallel strips of liquid or grease-like materials at a low vapor pressure, preferably oily substances, particularly as a cover on certain bands (DE 12 62 732) undergoing a subsequent metal vapor deposition. This apparatus comprises an evaporator vessel which is surrounded by a heating coil and has several evaporator nozzles to which vapor is supplied from a storage container. The tubular evaporator vessel has a number of nozzles to apply the agent onto the surface of the film. These nozzles are disposed corresponding to how far the covering strips are spaced apart and how wide they are.

For this purpose, it is advantageous that at least one drum which has a groove is passed in front of the nozzle outlet. This drum serves to hold the agent or oil and via the nozzle, it is applied into the vacuum and hence onto the film web. Further, it is advantageous that the groove extend approximately over the entire width of the drum and that the groove is disposed on the surface of the drum at an angle between 0° and 90° with respect to the transverse plane of the drum. With a minimum of labor involved, the film web can thus be partitioned in individual segments bounded by the transverse strips. Non-metallized areas are created due to the individual transverse and longitudinal strips which in turn permit reducing the short-circuit amplitude since the transverse strips insulate the one segment from its adjacent segment. The segmentation is a simple way of increasing the self-inductance and the inner resistance of the short-circuit arrangement since the metallized surface is advantageously interrupted by non-metallized transverse strips.

Further, it is advantageous to produce the individual strips by applying an oil film so that no metal vapor will deposit on this part of the surface.

In another embodiment of the invention, it is advantageous for the nozzle to have a plurality of juxtaposed outlet openings and to run parallel to the longitudinal axis of the drum. The nozzle is disposed in a diaphragm or a slide seal. It is thus possible to minimize wear in the area of the outlet opening or the seals since the film web readily passes these openings even when the edges of the individual openings do not open up or protrude radially.

Further, it is advantageous that the nozzle be a slot opening which extends approximately over the entire width of the film web. When a surface or the drum with the ascending groove moves perpendicularly underneath the nozzle with its slot opening, the visible portion inside the slot travels from the one side to the other so that, depending on the speed of the drum, transverse, slanting or longitudinal non-metallized strips are formed.

It is of particular importance in the apparatus of the invention that one part of the nozzle is a slide seal which sealingly urges against the rotating drum and which the film web sealingly passes and that non-metallized strips can be applied by means of vapor deposition in a transverse, ascending and/or perpendicular direction to the film web by the rotating drum and the nozzle.

In another embodiment of the invention, it is advantageous to provide parallel, spaced apart openings in the longitudinally running strips with at least one opening being provided between two transverse strips. The use of an interrupted, non-metallized longitudinal strip or its application by vapor deposition in the marginal area of the film leaves only one narrow strip for the current to flow, i.e. via the interruption provided in the longitudinal strip. The interruption functions as a safety measure, i.e. current flowing via this interruption causes a burn-through only at the narrow strip with no damage occurring at the adjacent films.

Moreover, it is advantageous to provide radially extending grooves on the drum which have one or several interruptions and that the drum moves in direction of the film and in synchrony with the speed of the film web.

Further features of the invention are represented in the description of the Figs. Note that all individual features and all combinations of individual features are essential to the invention.

BRIEF DESCRIPTION OF THE DRAWING

The Figs. show an embodiment of the invention as an example without restricting it thereto. Referring now to the Figs.

FIG. 3 is a sectional view of the sealing lip, FIG. 4 is a sectional view of a sealing element, FIG. 5 is a top view of the nozzle bar inclusive of numerous openings, FIG. 6 is a sectional representation of the evaporator chamber including a slide seal.

Figure 1:
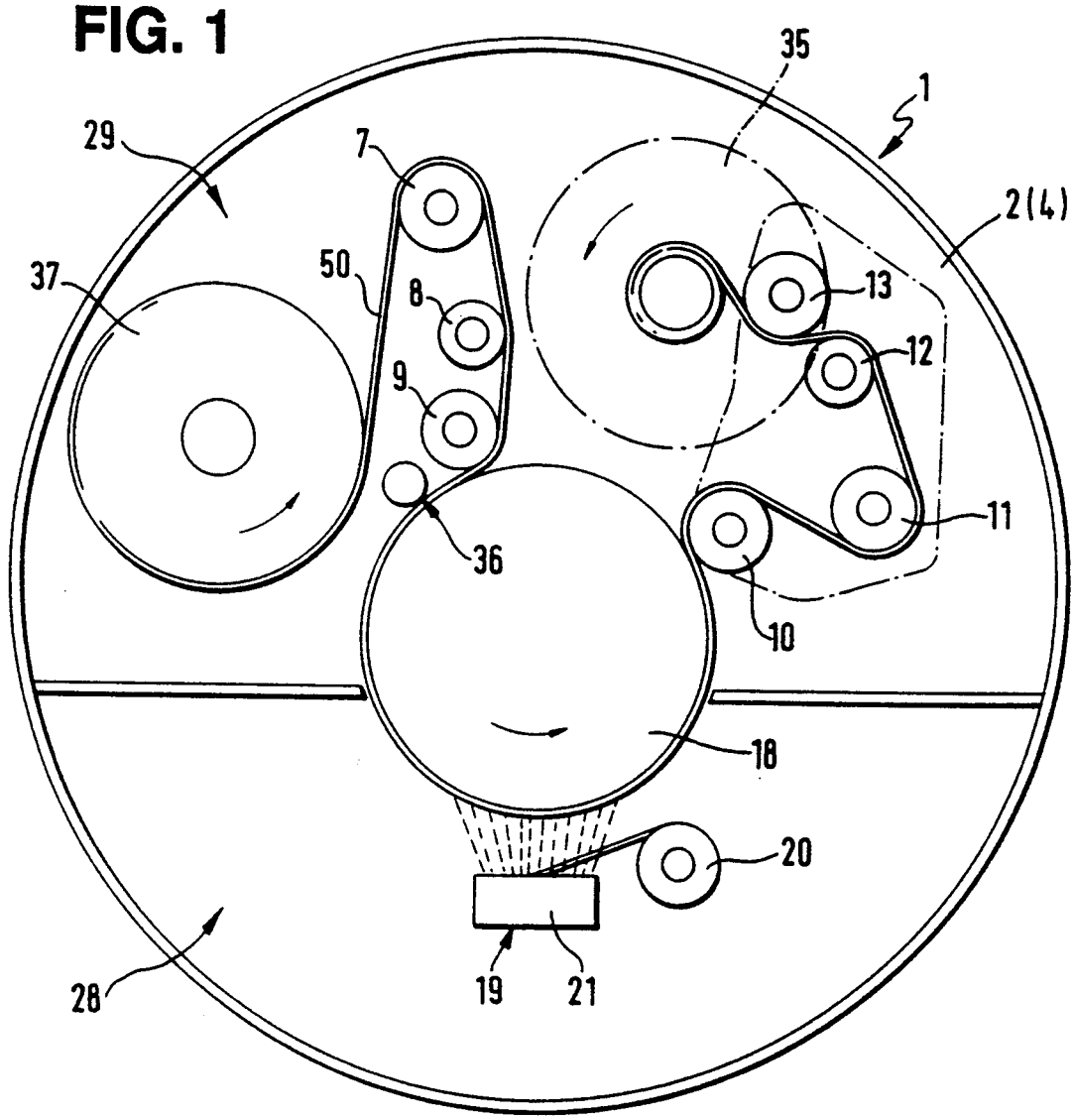
FIG. 1 is a sectional side view of a band-type coating apparatus comprising a winding device and numerous guide rollers for the film web.

In the drawing, reference numeral 1 designates a band-type coating apparatus which essentially comprises the guide, stretch and tension rollers 7 to 13 and the cooled coating drum 18 all disposed between the two side parts 2, 4. Further, the band-type coating apparatus 1 comprises a take-off roller 37, a take-up roller 35, a coating chamber 28 and an evaporator source 19 with a coil 20 of aluminum wire and the evaporator vessel 21. The winding device 29 is provided at the top half of the chamber.

Figure 7:
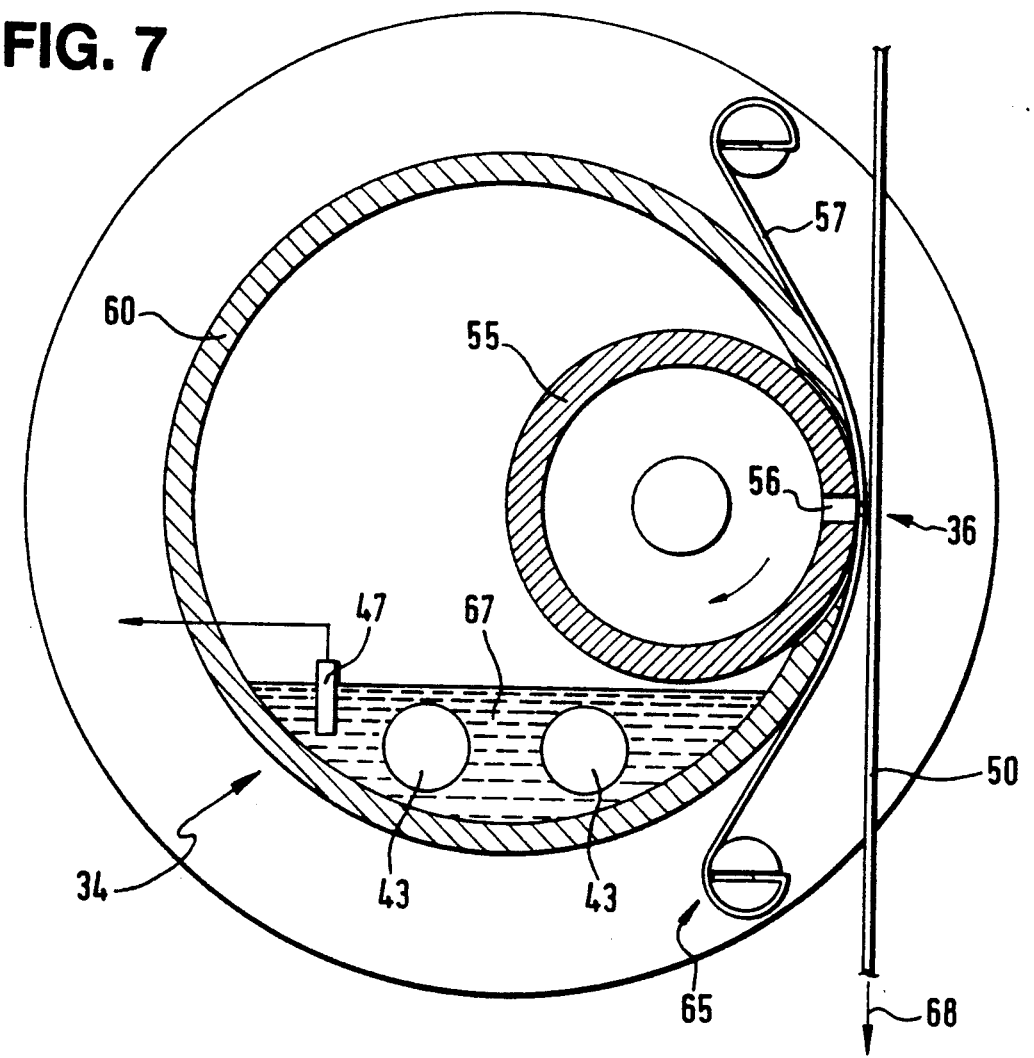
FIG. 7 is a sectional view of the guide roller of FIG. 1 comprising the capacitor film situated in front of the outlet opening of the evaporator.

An oil evaporator 34 as represented in FIGS. 6 and 7 includes a tubular or rectangular housing 60 which accommodates one or several rod-like heating elements 43. The latter are completely surrounded by agent or oil 67 to prevent deposition, and they are disposed in the area of a vapor outlet pipe which not shown in the drawing. The oil evaporator 34 can advantageously be provided with a temperature sensor 47 which permits an exact monitoring and maintenance of the average bath temperature. The electrical circuit necessary for monitoring the control of the heating circuit is not represented in the drawing.

Two rectangular brackets not shown hold the oil evaporator 34 between the two side parts 2, 4 in such a manner that the direction of jet of a nozzle 36 of the oil evaporator 34 is directed against the side of the band or the web 50 to be coated. FIG. 7 shows a similar arrangement of an oil evaporator 34.

As seen in FIG. 1, nozzle 36 is disposed in a segment between itself, a guide roller 9 and the coating drum 18 so that the actual coating process begins immediately after the passing film web 50 has been moistened with an agent 67. It is advantageous that no metal evaporated in vessel 21 is deposited on those parts of the film web 50 that were moistened with agent 67, for example silicone oil.

The type of nozzle 36 determines how many areas of the side surface of film web 50 will not be exposed to vapor deposition and remain uncoated.

In the apparatus of FIG. 1, the rollers for conveying and guiding the film web 50 are disposed such that the one part of the film web which is directly in front of the coating drum 18 runs at an acute angle toward the bottom, i.e. almost vertically down from drum 9. It is also possible to have a different guiding of this part of the film web 50. For example, it can run on an approximately horizontal plane according to FIG. 6 on the coating drum 18 without requiring any structural modifications of the oil evaporator 34 not shown in FIG. 6.

As seen in FIG. 6 and 7, a cylindrical drum 55, having a groove 56 on its surface, is movably disposed in the housing of oil evaporator 34. This groove 56 runs at an angle between 0° and 90°. It serves to hold the oil film so that the oil vapor can be released via nozzle 36 into the vacuum-onto the surface of film web 50. The coating drum 18 passes this film web 50 by the drum 55.

Small openings can connect groove 56 to the interior of drum 55. This interior may be filled with oil vapor to transfer a sufficient amount of vapor to the passing film.

Figure 2:
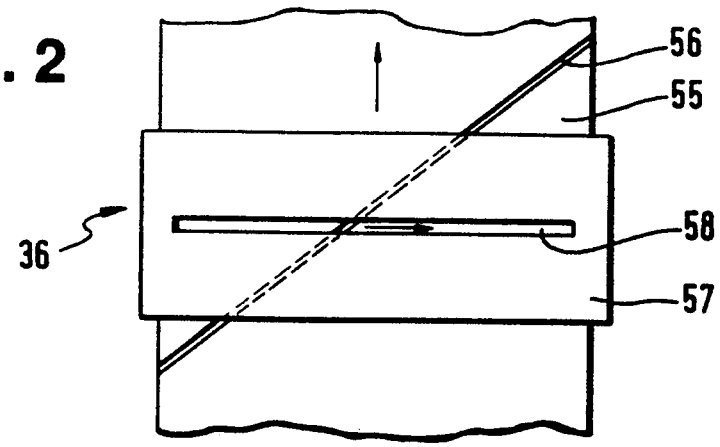
FIG. 2 shows a winding of a drum having a groove inclusive of the corresponding diaphragm which has a transverse slot.

As seen in FIGS. 2, 5 and 6, nozzle 36, which is only diagrammatically represented in FIGS. 1, 2, is placed in a slide seal and is formed by a transversely running slot 57 or by numerous juxtaposed bores 59 according to FIG. 5.

Figure 8:
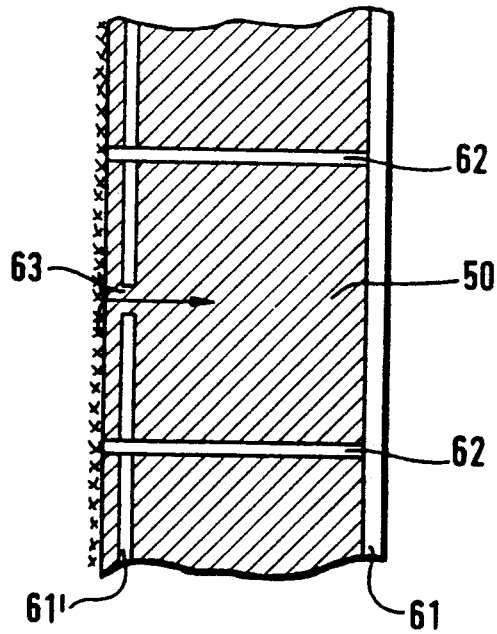
FIG. 8 shows the surface of a film web.

In FIG. 8, the hatched area represents film web 50 on which vertical strips 61, 61, and horizontal strips 62 are applied by vapor deposition. Nozzle 36 and oil evaporator 34 serve to apply these strips 61, 62 onto the surface of film web 50 by vapor deposition. For this purpose, there is an oil bath contained in housing 60 which is heated up by means of heater not shown in the drawing. The oil is heated up to the desired temperature so that it can evaporate once the working pressure is reached and the nozzles are opened. Oil 67 then emerges only at groove 56 in drum 55 since only one segment is opened. As mentioned earlier, the oil film applied onto the surface of film web 50 depends on the circumferential speed of drum 55 and the movement of film web 50.

Strips 61, 62 must not necessarily run vertically nor horizontally. The distance between the transverse strips 61, 62 can, for example, range between 60 and 80 mm depending on the apparatus or the configuration of the film web 50.

When agent 67 is applied by vapor deposition in the form of transverse strips, no metal is deposited on this location.

FIG. 2 or FIG. 5 show the use of a stationary slot 58 or of bores 59 which are closely juxtaposed. When drum 55, on which a groove 56 moves under an angle between 0° and 90°, is moved perpendicular thereto (FIG. 2 shows the winding of drum 55 according to FIG. 6 and 7), then the visible portion inside slot 58 travels from one side to the other.

In its housing 60, the oil evaporator 34 accommodates the rotating drum 55 with its grooves 56. The grooves 56 can extend either radially with a slope over the entire width of the film web 50 or they can have radial interruptions.

The slot 58 the openings 59 of the stationary seal 57, which slides or has a sliding surface releases, expose segments of the grooves 56. When drum 55 rotates, the segment of the axially running groove 56 travels, as already mentioned, from the one side to the other. When a jet of oil vapor emerges during rotation via nozzle 36 or slot 58 or openings 59, a strip of a transverse or any other direction is deposited onto the surface of the passing film web 50. The longitudinal strips 61' with their interruptions and/or openings 63 are thus deposited due to the interrupted radial grooves.

When drum 55 rotates in synchrony with the film web 50, then the winding pattern of groove 56 of FIG. 2 is exactly reproduced on the film.

A diameter of 80 mm of drum 55 and a vapor deposition width of 650 mm produces a transverse strip with angle of inclination of 21°. The strips are then spaced approximately 250 mm apart (this corresponds to the drum circumference). For four single-flight grooves 56, the distance amounts to approximately 63 mm.

In the embodiment of FIG. 4, the sealing lip 64 urges against the surface of drum 55. The so formed sealing lip 64 can be exposed to increased wear when the groove opens up. It is therefore advantageous, in accordance with FIG. 5, to provide a plurality of closely adjacent openings 59. The individual openings 59 can be advantageously arranged in two or several rows underneath one another where they are offset so that a continuous strip is reproduced on the surface of the film webs 50. It is thus not possible for the edge to get caught in groove 56.

In the form of a capton film or a metal film, the slide seal 57, following a bent, can then be made to rest against drum 55 (cf. FIG. 7). The foil can either pass the nozzle 36 in a sliding movement or spaced apart from it at a small distance. Slide seal 57 can be tightened, for example, with a tightener 65. The web 50 passes the slide seal 57 in direction of arrow 68. The bent slide seal of FIGS. 3 and 7 enlarges the sealing surface, and now not only the sealing lip 64 of FIG. 5 seals with respect to drum 55 but the entire sealing surface.

I claim:

1. Apparatus for producing strips of masking agent on film webs coated in a vacuum, comprising a housing which is pressure-tight closed, a device for taking in and conveying a film web, an evaporating source provided in the housing which has at least one nozzle for an outlet of an evaporating agent to prevent a deposition on the passing film web, the nozzle being formed by at least one opening extending over the entire width of the film web, the apparatus including a drum which has a longitudinal axis and which has at least one slot which passes in front of the outlet of nozzle.

2. Apparatus in accordance with claim 1 in which the drum moves in longitudinal direction of the film and in synchrony with the speed of the film web.

3. Apparatus in accordance with claim 1, which includes a slot which extends approximately over the entire width of drum.

4. Apparatus in accordance with claim 3, which includes, with respect to the transverse plane of drum 55, a groove 56 on the surface of the drum 55 at an angle between 0° and 90°.

5. Apparatus in accordance with claim 2, in which the nozzle 36 has a plurality of closely juxtaposed outlet openings 59, and the nozzle 36 runs parallel to the longitudinal axis of drum 55, the nozzle 36 being disposed in a slide seal 57.

6. Apparatus in accordance with claim 5, in which the nozzle 36 is part of the slide seal 57 which sealingly urges against the rotating drum 55 and in front of which the film web 50 sealingly passes.

7. Apparatus in accordance with claim 1, in which the nozzle is formed by a slot opening which extends over the entire width of the film web.

8. Apparatus in accordance with claim 1, in which rotating drum and nozzle apply non-metallized strips onto the surface of the film web in a transverse direction of the film web by means of vapor deposition.

9. Apparatus in accordance with claim 8, which includes spaced apart openings in the longitudinally running strips, with at least one opening being provided between two transversely running strips.

10. Apparatus in accordance with claim 1 in which the drum has one or several radially extending grooves, which have one or several interruptions.

* * * * *